(12) United States Patent
Kinoshita

(10) Patent No.: US 11,411,105 B2
(45) Date of Patent: Aug. 9, 2022

(54) SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 24 days.

(21) Appl. No.: 17/161,867

(22) Filed: Jan. 29, 2021

(65) Prior Publication Data

US 2021/0296492 A1 Sep. 23, 2021

(30) Foreign Application Priority Data

Mar. 17, 2020 (JP) .............................. JP2020-046992

(51) Int. Cl.
*H01L 29/78* (2006.01)
*H01L 29/16* (2006.01)

(52) U.S. Cl.
CPC ...... *H01L 29/7813* (2013.01); *H01L 29/1608* (2013.01)

(58) Field of Classification Search
CPC ......................... H01L 29/7813; H01L 29/1608
USPC ........................................................ 257/77
See application file for complete search history.

(56) References Cited

U.S. PATENT DOCUMENTS

| 2007/0155104 A1 | 7/2007 | Marchant et al. |
| 2014/0167151 A1* | 6/2014 | Yen ..................... H01L 29/4236 438/270 |
| 2018/0114856 A1 | 4/2018 | Nakano |

FOREIGN PATENT DOCUMENTS

| CN | 110637374 A | * 12/2019 | ......... H01L 29/0619 |
| JP | 2009-522807 A | 6/2009 | |
| JP | 6600475 B2 | 10/2019 | |

* cited by examiner

*Primary Examiner* — Igwe U Anya
(74) *Attorney, Agent, or Firm* — Rabin & Berdo, P.C.

(57) ABSTRACT

A semiconductor device includes an active region through which a main current passes during an ON state. In the active region, the semiconductor device includes a semiconductor substrate of a first conductivity type, a first semiconductor layer of the first conductivity type, a second semiconductor layer of a second conductivity type, first semiconductor regions of the first conductivity type, gate insulating films, gate electrodes, an interlayer insulating film, first electrodes, a second electrode, first trenches, a second trench, a polycrystalline silicon layer provided in the second trench via one of the gate insulating films, and a silicide layer selectively provided in a surface layer of the polycrystalline silicon layer. The polycrystalline silicon layer and the silicide layer are electrically connected with the gate electrodes.

6 Claims, 12 Drawing Sheets

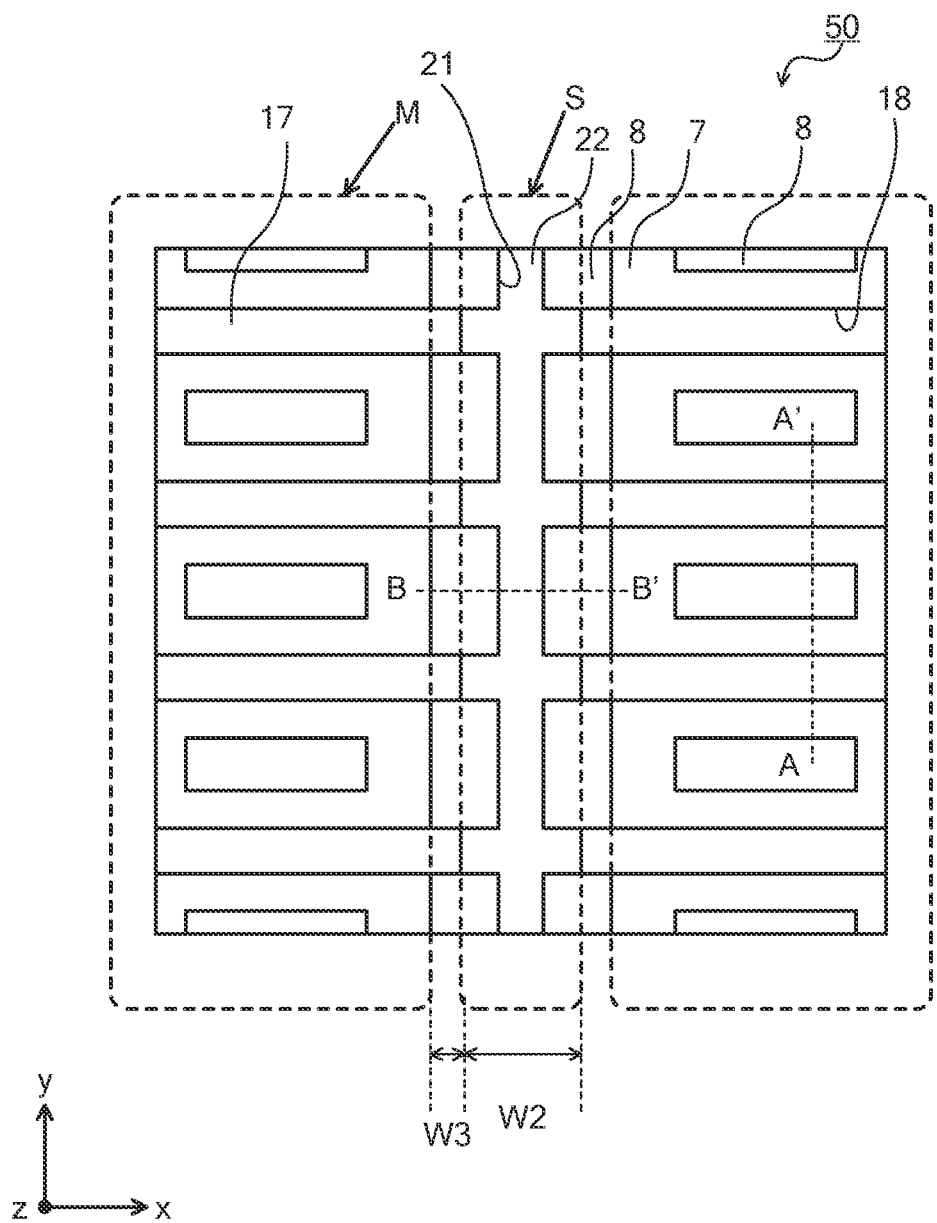

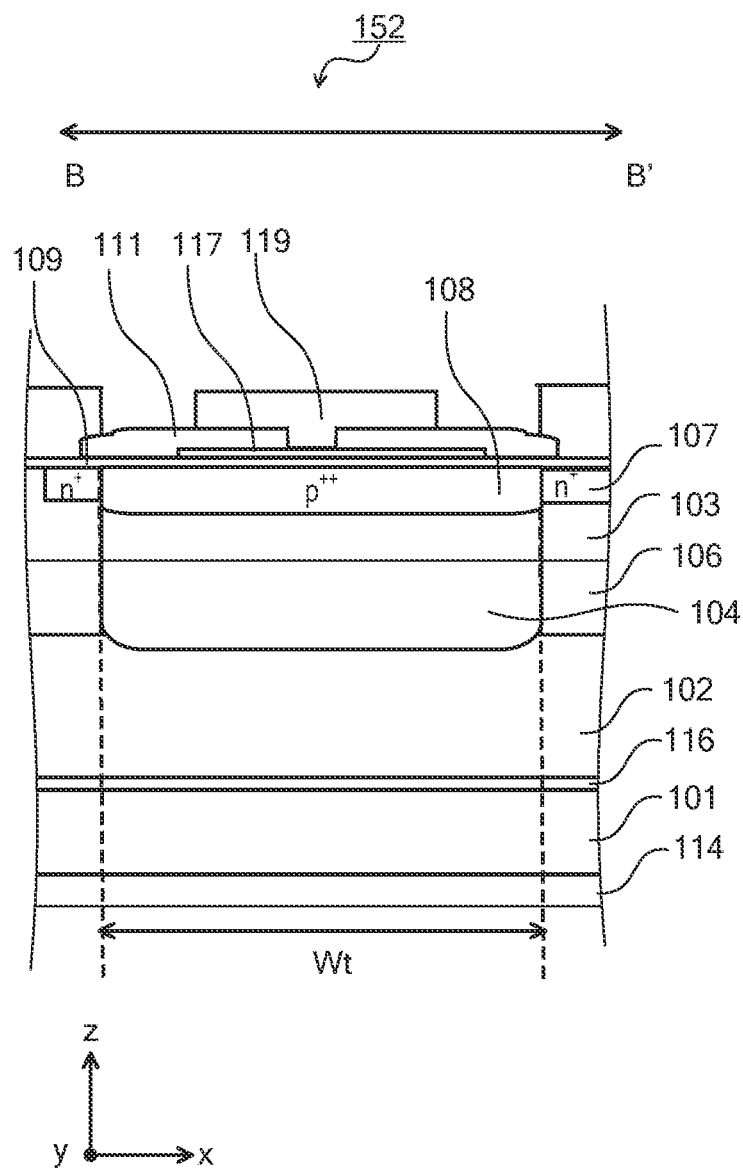

SILICON CARBIDE SEMICONDUCTOR DEVICE

CROSS REFERENCE TO RELATED APPLICATIONS

This application is based upon and claims the benefit of priority of the prior Japanese Patent Application No. 2020-046992, filed on Mar. 17, 2020, the entire contents of which are incorporated herein by reference.

BACKGROUND OF THE INVENTION

1. Field of the Invention

Embodiments of the invention relate to a silicon carbide semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost. A planar gate structure is a MOS gate structure in which a MOS gate is provided in a flat plate-like shape on the front surface of a semiconductor substrate.

A structure of a conventional silicon carbide semiconductor device is described taking a trench-type MOSFET as an example. FIG. 13 is a top view of the structure of the conventional silicon carbide semiconductor device. As depicted in FIG. 13, in an outer periphery of an active region 153 through which a main current flows, an edge termination region 154 that sustains breakdown voltage is provided surrounding a periphery of the active region 153. In the active region 153, a gate electrode pad 120 electrically connected to gate electrodes and a source electrode pad 115 electrically connected to source electrodes are provided.

Conventionally, in instances in which the chip size of a power MOSFET increases, to suppress variation of gate resistance between the gate electrode pad 120 and gate electrodes, a gate runner 152 having a metal structure is provided at a chip surface so as to traverse the active region 153.

FIGS. 14A and 14B are cross-sectional views of the structure of the conventional silicon carbide semiconductor device depicted in FIG. 13; FIG. 14A is a cross-sectional view along cutting line A-A' in FIG. 13 and FIG. 14B is a cross-sectional view along cutting line B-B' in FIG. 13. In FIGS. 14A and 14B, only the active region 153 of a trench-type MOSFET 150 in FIG. 13 is depicted. In the trench-type MOSFET 150, a MOS structure region 151 and the gate runner 152 are provided in the active region 153.

As depicted in FIGS. 14A and 14B, an $n^+$-type buffer layer 116 and an n-type silicon carbide epitaxial layer 102 are deposited on a front surface of an $n^+$-type silicon carbide substrate 101. On a surface of the n-type silicon carbide epitaxial layer 102, opposite a surface thereof facing the $n^+$-type silicon carbide substrate 101, an n-type high-concentration region 106 is provided. Further, in the n-type high-concentration region 106 at a surface thereof opposite that facing the $n^+$-type silicon carbide substrate 101, first $p^+$-type base regions 104 are selectively provided. In the n-type high-concentration region 106, second $p^+$-type base regions 105 are selectively provided so as to underlie an entire area of a bottom of each of the trenches 118.

Further, in the MOS structure region 151, a p-type silicon carbide epitaxial layer 103, $n^+$-type base regions 107, $p^{++}$-type contact regions 108, gate insulating films 109, the gate electrodes 110, an insulating film 111, source electrodes 113, a back electrode 114, the trenches 118, a source electrode pad 115, and a drain electrode pad (not depicted) are further provided. The source electrodes 113 are provided on the $n^+$-type base regions 107 and the $p^{++}$-type contact regions 108, and the source electrode pad 115 is provided on the source electrodes 113.

In the trench-type MOSFET 150, the gate electrodes 110 are intricately drawn throughout the chip surface and therefore, there are regions that are a far distance from the gate electrode pad 120 that is for applying voltage from an external source. In general, in a power MOSFET, gate wiring 119 electrically connecting the gate electrodes 110 and the gate electrode pad 120 is formed by polycrystalline silicon poly-Si). Resistance of polycrystalline silicon is not that low and therefore, for the gate electrodes 110 further apart from the gate electrode pad 120, resistance of the gate wiring 119 increases as compared to that for the gate electrodes 110 closer to the gate electrode pad 120 and differences in operating time may occur at the chip surface.

To solve this problem, in a large chip, for example, a chip in which one edge is at least 3 mm, a structure (gate runner) that overlaps and wires low-resistance metal is created in an outer periphery of the chip or in the active region 153, so that the resistance of the gate wiring 119 becomes equalized. For example, as depicted in FIG. 13, the gate runner 152 having a metal structure is configured at the surface, traversing the active region 153.

As depicted in FIGS. 14A and 14B, the gate runner 152, similarly to the MOS structure region 151, includes the $n^+$-type silicon carbide substrate 101, the $n^+$-type buffer layer 116, the n-type silicon carbide epitaxial layer 102, the p-type silicon carbide epitaxial layer 103, the $n^+$-type base regions 107, and the $p^{++}$-type contact regions 108 are provided. The gate insulating films 109 are provided on the p-type silicon carbide epitaxial layer 103, the $n^+$-type base regions 107, and the $p^{++}$-type contact regions 108; and the polycrystalline silicon layer 117 and the interlayer insulating film 111 are provided on the gate insulating films 109. The gate wiring 119 is provided connected to the polycrystalline silicon layer 117 through openings provided in the interlayer insulating film 111. Here, the polycrystalline silicon layer 117 is electrically connected to the gate electrodes 110 of the MOS structure region 151 and is connected to the gate electrode pad 120 via the gate wiring 119.

Further, to obtain high avalanche capability, a semiconductor device is known that includes multiple gate finger trenches and gate fingers traversing the gate finger trenches and electrically connected to the gate electrodes (for example, refer to Japanese Patent No. 6600475).

Further, a trench-gate field effect transistor (FET) is known that is demarcated in a silicon region so that multiple active gate trenches are adjacent to at least one gate runner trench (for example, refer to Japanese Laid-Open Patent Publication No. 2009-522807).

SUMMARY OF THE INVENTION

According to an embodiment of the invention, a silicon carbide semiconductor device having an active region through which a main current passes during an ON state, includes in the active region, a silicon carbide semiconductor substrate of a first conductivity type, the silicon carbide semiconductor substrate having a front surface and a back surface that are opposite to each other; a first semiconductor layer of the first conductivity type, provided on the front surface of the silicon carbide semiconductor substrate, the first semiconductor layer having an impurity concentration lower than an impurity concentration of the silicon carbide semiconductor substrate, the first semiconductor layer having a first surface and a second surface that are opposite to each other, the second surface facing the silicon carbide semiconductor substrate; a second semiconductor layer of a second conductivity type, selectively provided on the first surface of the first semiconductor layer, the second semiconductor layer having a first surface and a second surface that are opposite to each other, the second surface facing the first semiconductor layer; a plurality of first semiconductor regions of the first conductivity type, each selectively provided in the second semiconductor layer, at the first surface thereof; a plurality of first trenches each penetrating the second semiconductor layer and reaching the first semiconductor layer; a plurality of gate electrodes provided in the first trenches, via a plurality of gate insulating films, respectively; a plurality of first electrodes each provided on surfaces of the second semiconductor layer and the first semiconductor regions; a second electrode provided on the back surface of the silicon carbide semiconductor substrate; a second trench that penetrates the second semiconductor layer and reaches the first semiconductor layer; a polycrystalline silicon layer provided in the second trench, via one of the gate insulating films, the polycrystalline silicon layer having a first surface and a second surface that are opposite to each other, the second surface facing the silicon carbide semiconductor substrate; a silicide layer selectively provided in the polycrystalline silicon layer, at the first surface thereof; and an interlayer insulating film provided on the gate electrodes and the silicide layer. The polycrystalline silicon layer and the silicide layer are electrically connected with the gate electrodes.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a top view of the structure of the silicon carbide semiconductor device according to the embodiment depicted in FIGS. 1A and 1B.

FIG. 14B is a cross-sectional view of the structure of the conventional silicon carbide semiconductor device depicted in FIG. 13

DETAILED DESCRIPTION OF THE INVENTION

Figure 14A:
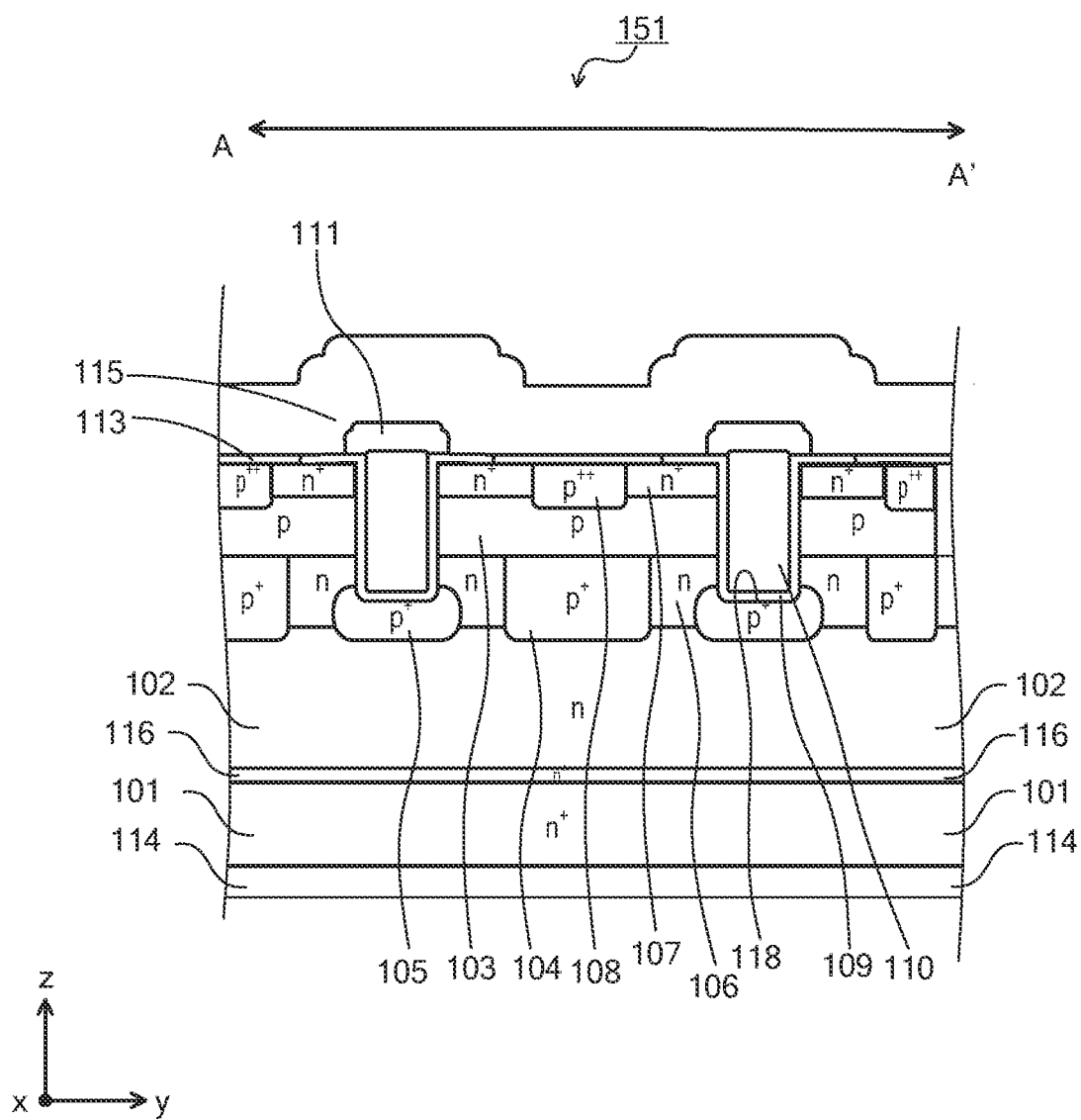
FIG. 14A is a cross-sectional view of the structure of the conventional silicon carbide semiconductor device depicted in FIG. 13

First, problems associated with the conventional techniques are discussed. As described above, when chip size increases, while disposal of the gate runner 152 in the active region 153 is necessary, the gate wiring 119 is provided on the interlayer insulating film 111 and therefore, a portion of the active region 153 has to be sacrificed. Furthermore, in the gate runner 152, the gate wiring 119 having a metal structure has to be formed at the chip surface and therefore, a large region is necessary. For example, a width Wt (width of the openings provided in the source electrode pad 115) of the gate runner 152 depicted in FIGS. 14A and 14B has to be about 100 μm.

Furthermore, the source electrode pad 115 is divided, the gate runner 152 is provided, and on the gate runner 152, wiring to connect the source electrode pad 115 cannot be provided. Therefore, constraints occur such as in bonding positions and bonding direction when wire bonding is performed.

Embodiments of a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1A:
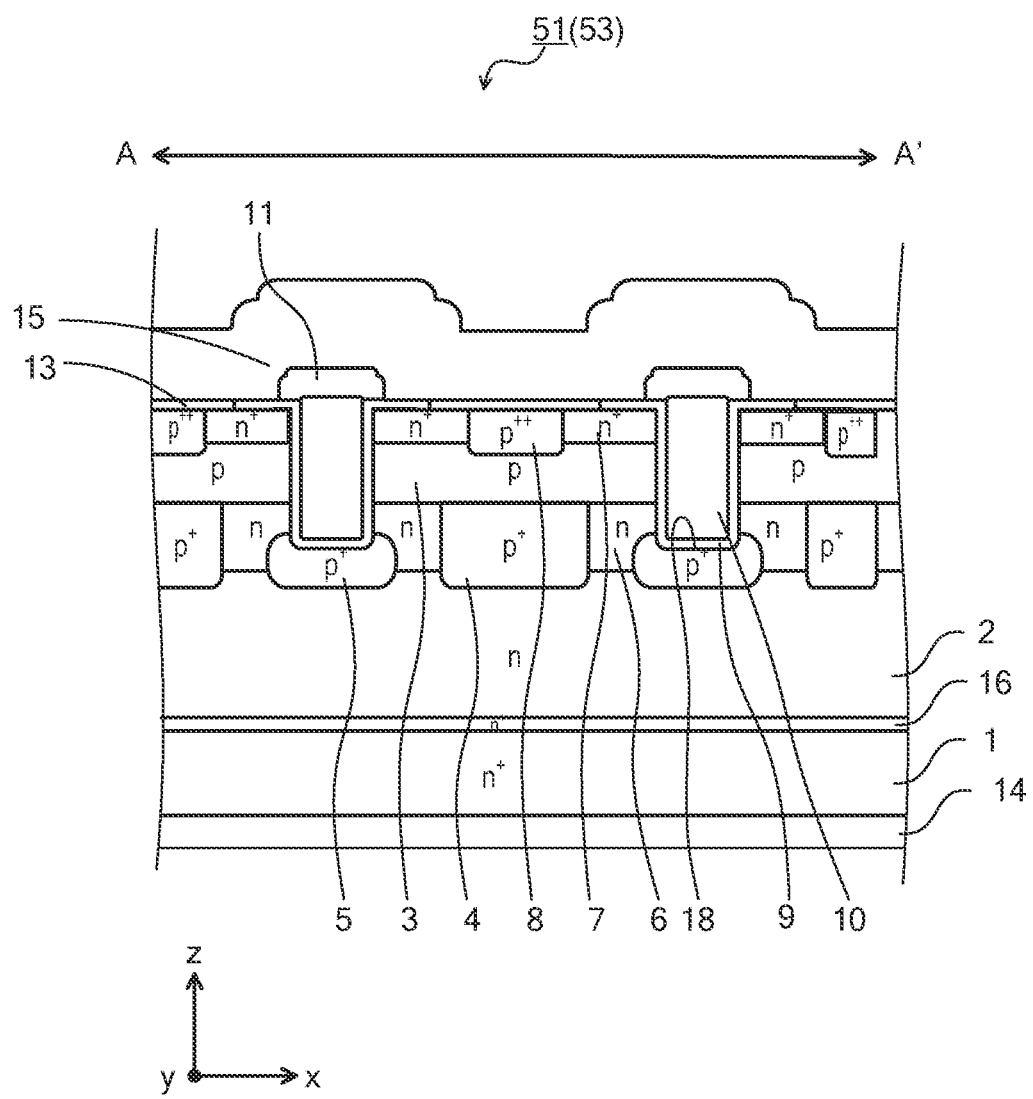
FIG. 1A is a cross-sectional view of a structure of a silicon carbide semiconductor device according to an embodiment, along cutting line A-A' in FIG. 2.
Figure 1B:
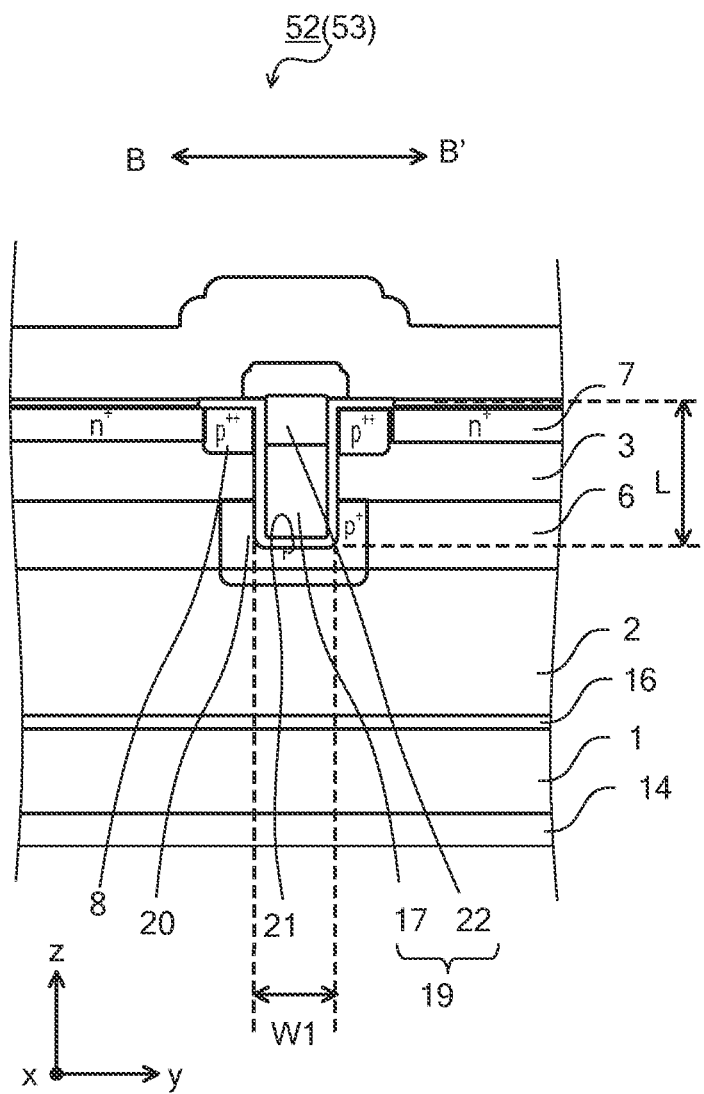
FIG. 1B is a cross-sectional view of the structure of the silicon carbide semiconductor device according to the embodiment, along cutting line B-B' in FIG. 2.

A semiconductor device according to the embodiment is configured using a semiconductor having a bandgap wider than that of silicon (Si) (hereinafter, wide bandgap semiconductor). A structure of the semiconductor device according to the embodiment is described taking, as an example, an instance in which, for example, silicon carbide (SiC) is used as a wide bandgap semiconductor. FIGS. 1A and 1B are cross-sectional views of the structure of the silicon carbide semiconductor device according to the embodiment; FIG. 1A is a cross-sectional view along cutting line A-A' in FIG. 2 and FIG. 1B is a cross-sectional view along cutting line B-B' in FIG. 2.

In the silicon carbide semiconductor device according to the embodiment, in an outer periphery of an active region 53 through which a main current passes, an edge termination region that surrounds a periphery of the active region 53 and sustains a breakdown voltage is provided. In FIGS. 1A and 1B, only the active region 53 of a trench-type MOSFET is depicted. The active region 53 of the trench-type MOSFET includes a MOS structure region 51 and a gate runner 52.

As depicted in FIGS. 1A and 1B, the MOS structure region 51 of a trench-type MOSFET 50 includes MOS gates having a trench-gate structure on a front side (side having a p-type silicon carbide epitaxial layer 3 described hereinafter) of a semiconductor base. A silicon carbide semiconductor base is formed by sequentially forming an n-type silicon carbide epitaxial layer (first semiconductor layer of the first conductivity type) 2 and the p-type silicon carbide epitaxial layer (second semiconductor layer of a second conductivity type) 3 by epitaxial growth on an n$^+$-type silicon carbide substrate (semiconductor substrate of a first conductivity type) 1 containing silicon carbide. An n$^+$-type buffer layer 16 may be epitaxially grown on the n$^+$-type silicon carbide substrate 1. Further, n-type high-concentration regions 6 may be epitaxially grown on the n-type silicon carbide epitaxial layer 2.

The MOS gates having the trench gate structure are configured by the p-type silicon carbide epitaxial layer 3, n$^+$-type source regions (first semiconductor regions of the first conductivity type) 7, p$^{++}$-type contact regions 8, trenches (first trenches) 18, gate insulating films 9, and gate electrodes 10.

In particular, the trenches 18 penetrate the p-type silicon carbide epitaxial layer 3 in a depth direction z from a front surface of the semiconductor base and reach the n-type high-concentration regions 6 (in an instance in which the n-type high-concentration regions 6 are not provided, the n-type silicon carbide epitaxial layer 2, hereinafter, simply (2)). The depth direction z is a direction from the front surface toward a back surface thereof. The trenches 18, for example, are disposed in a stripe pattern.

In the trenches 18, the gate insulating films 9 are provided along inner walls of the trenches 18, and the gate electrodes 10 are provided so as to be embedded in the trenches 18 on the gate insulating films 9. One unit cell of a main semiconductor device element is configured by one of the gate electrodes 10 in one of the trenches 18, and one of the gate electrodes 10 between adjacent mesa regions (region between adjacent trenches of the trenches 18). In FIG. 1A, while only two trench MOS structures are depicted, further MOS gate (insulated gate including a metal, an oxide film, and a semiconductor) structures having a trench structure may be disposed.

On a front surface of the n$^+$-type silicon carbide substrate 1, the n$^+$-type buffer layer 16 may be provided. The n$^+$-type buffer layer 16 has an impurity concentration that is about equal to that of the n$^+$-type silicon carbide substrate 1 and, for example, is a buffer layer doped with nitrogen. Recombination of electron-holes progresses in the n$^+$-type buffer layer 16, suppressing hole density injected into the n$^+$-type silicon carbide substrate 1, whereby the occurrence of triangular and bar-shaped stacking faults may be effectively suppressed.

In the n-type silicon carbide epitaxial layer 2, in a surface layer thereof facing source electrodes 13 described hereinafter, n-type regions (hereinafter, n-type high-concentration regions) 6 may be provided so as to be in contact with the p-type silicon carbide epitaxial layer 3. The n-type high-concentration regions 6 are a so-called current spreading layer (CSL) that reduces carrier spreading resistance. The n-type high-concentration regions 6, for example, are provided uniformly in a direction parallel to a substrate front surface (the front surface of the semiconductor substrate) so as to be exposed at the inner walls of the trenches 18.

The n-type high-concentration regions 6, from respective interfaces thereof with the p-type silicon carbide epitaxial layer 3, reach positions deeper on a drain side (deep positions closer to the back electrode 14) than are bottoms of the trenches. In the n-type high-concentration regions 6, first and second p$^+$-type base regions 4, 5 may each be selectively provided. The first p$^+$-type base regions 4 are provided between adjacent trenches of the trenches 18 (mesa regions) to be separate from second p$^+$-type base regions 5 and the trenches 18, and to be in contact with the p-type silicon carbide epitaxial layer 3. Of the bottoms and bottom corner portions of the trenches 18, the second p$^+$-type base regions 5 underlie at least the bottoms of the trenches 18. The bottom corner portions of the trenches 18 are borders between the bottoms and sidewalls of the trenches 18.

Pn junctions between the first and the second p$^+$-type base regions 4, 5 and the n-type silicon carbide epitaxial layer 2 are formed at deep positions closer to the back electrode 14 than are the bottoms of the trenches 18. The first and the second p$^+$-type base regions 4, 5 may be provided in the n-type silicon carbide epitaxial layer 2 without providing the n-type high-concentration regions 6. Each of the first and the second p$^+$-type base regions 4, 5 has an end facing the back electrode 14, at a depth position so that the pn junctions between the first and the second p$^+$-type base regions 4, 5 and the n-type silicon carbide epitaxial layer 2 are closer to the back electrode 14 than are the bottoms of the trenches 18, the depth position being changeable according to design conditions. Application of high electric field to portions of the gate insulating films 9 along the bottoms of the trenches 18 may be prevented by the first and the second p$^+$-type base regions 4, 5.

The n$^+$-type source regions 7 are selectively provided in the p-type silicon carbide epitaxial layer 3. The p$^{++}$-type contact regions 8 may be selectively provided so as to be in contact with the n$^+$-type source regions 7. The n$^+$-type source regions 7 are in contact with the gate insulating films 9 at the sidewalls of the trenches 18 and face the gate electrodes 10, across the gate insulating films 9 at the sidewalls of the trenches 18.

An interlayer insulating film 11 is provided in an entire area of the front surface of the semiconductor substrate so as to cover the gate electrodes 10. In the interlayer insulating film 11, contact holes penetrating through the interlayer insulating film 11 in the depth direction z and reaching the substrate front surface are opened.

The source electrodes (first electrodes) 13 are in ohmic contact with the semiconductor substrate (the n$^+$-type source regions 7) in the contact holes and are electrically insulated from the gate electrodes 10 by the interlayer insulating film 11. A source electrode pad 15 is provided on the source electrodes 13. In an instance in which the p$^{++}$-type contact regions 8 are provided, the source electrodes 13 are in contact with the p$^{++}$-type contact regions 8. In an instance in which the p$^{++}$-type contact regions 8 are not provided, the source electrodes 13 are in ohmic contact with the p-type silicon carbide epitaxial layer 3.

The back electrode (second electrode) 14 that is a drain electrode is provided on the back surface of the semiconductor substrate. A drain electrode pad (not depicted) is provided on the back electrode 14.

Further, as depicted in FIG. 1B, the gate runner 52, similarly to the MOS structure region 51, includes portions of the n$^+$-type silicon carbide substrate 1, the n$^+$-type buffer layer 16, the n-type silicon carbide epitaxial layer 2, the p-type silicon carbide epitaxial layer 3, the n$^+$-type source regions 7, and the p$^{++}$-type contact regions 8.

In the embodiment, a gate wiring trench (second trench) 21 is formed in the active region 53 and a gate wire 19 is provided in the gate wiring trench 21. In particular, the gate wiring trench 21 penetrates the p-type silicon carbide epitaxial layer 3 from the front surface of the semiconductor substrate in the depth direction z and reaches the n-type high-concentration regions 6 (2). The gate wiring trench 21, for example, is disposed in a stripe shape. A p$^+$-type region 20 underlies a bottom and sidewalls of the gate wiring trench 21 so that MOS operation does not occur at the gate wiring trench 21.

In the gate wiring trench 21, one of the gate insulating films 9 is provided along an inner wall of the gate wiring trench 21 and on the gate insulating film 9, a polycrystalline silicon layer 17 is provided so as to be embedded in the gate wiring trench 21. Further, in a portion or in all of the polycrystalline silicon layer 17, a silicide layer 22 having resistance lower than the resistance of polycrystalline silicon is provided. A thickness of the silicide layer 22 is about equal to a film thickness of the polycrystalline silicon that is deposited when the polycrystalline silicon layer 17 is formed. For example, when the film thickness of the polycrystalline silicon is about 0.5 μm, the thickness of the silicide layer 22 is about 0.5 μm.

FIG. 1B depicts an instance in which the silicide layer 22 is provided at an upper portion (portion facing the interlayer insulating film 11) of the polycrystalline silicon layer 17. The polycrystalline silicon layer 17 and the silicide layer 22 combined form the gate wire 19. The gate wire 19 is electrically connected to the gate electrodes 10 of the MOS structure region 51; and the gate electrodes 10 and gate electrode pad are electrically connected through the gate wire 19. In the embodiment, by providing the silicide layer 22, gate resistance between the gate electrode pad and the gate electrodes 10 may be reduced.

A width of the gate wiring trench 21 may be preferably at most 1 μm. The film thickness of the polycrystalline silicon when the polycrystalline silicon layer 17 is embedded in the gate wiring trench 21 is about 0.5 μm. Thus, when the width of the gate wiring trench 21 is two times greater than the film thickness of the polycrystalline silicon, the gate wiring trench 21 cannot be embedded with the polycrystalline silicon layer 17 and voids may occur therein.

In this manner, in the embodiment, when a trench structure is used as a structure of the gate runner 52, the gate runner 52 may be configured by a small area. For example, the gate runner 52 may be formed by an area equal to one cell of the MOS structure region 51 and when a size of each of the trenches 18 and a size of the gate wiring trench 21 are equal (equal or same: within about ±5% of one another with consideration of manufacturing variation), a width W1 of the gate runner 52 may be in a range from 0.5 μm to 1.0 μm, narrower than a conventional width of about 100 μm. Therefore, in the active region 53 (refer to FIGS. 1A and 1B), a region that may be used as the MOS structure region 51 may be increased. A width of the p$^+$-type region 20 is at most 5 μm.

Furthermore, the source electrode pad 15 is provided on a surface of the gate runner 52 and a surface structure is structured similarly to the structure of the conventional MOS structure region 151. Unlike a conventional configuration, the gate wire 19 is not exposed at the surface and therefore, constraints on wiring bonding positions and direction are eliminated. Further, the surface of the gate runner 52 becomes flat to a similar extent as that of the MOS structure region 51. In particular, thicknesses of portions of the interlayer insulating film 11 in the gate runner 52 and in the MOS structure region 51 become about equal and therefore, portions of the source electrode pad 15 in the gate runner 52 and in the MOS structure region 51 are flat to a same extent.

FIG. 2 is a top view of the structure of the silicon carbide semiconductor device according to the embodiment depicted in FIGS. 1A and 1B, portions on the front surface thereof above the source electrodes 13 are not depicted. As depicted in FIG. 2, the trenches 18 and the gate wiring trench 21 each have a stripe shape, a direction in which the trenches 18 extend and a direction in which the gate wiring trench 21 extends are orthogonal to each other. A portion S operating as the gate runner is provided between portions M operating as the MOSFET. Further, at portions of the gate wiring trench 21 connecting the trenches 18, the silicide layer 22 may extend in the direction in which the trenches 18 extend (x-axis direction). Further, a width W2 of the portion S operating as the gate runner is about 5 μm. A distance W3 between the silicide layer 22 and the portions M operating as the MOSFET, i.e., a distance between the silicide layer 22 and the n$^+$-type source regions 7 may be preferably at least equal to a depth L (refer to FIGS. 1A and 1B) of the gate wiring trench 21. As a result, effects of the silicide layer 22 on the operation of the MOSFET may be reduced.

Next, a method of manufacturing the silicon carbide semiconductor device according to the embodiment is described. FIGS. 3, 4, 5, 6, 7, 8, 9, and 10 are cross-sectional views of states of the silicon carbide semiconductor device according to the embodiment during manufacture.

Figure 3:
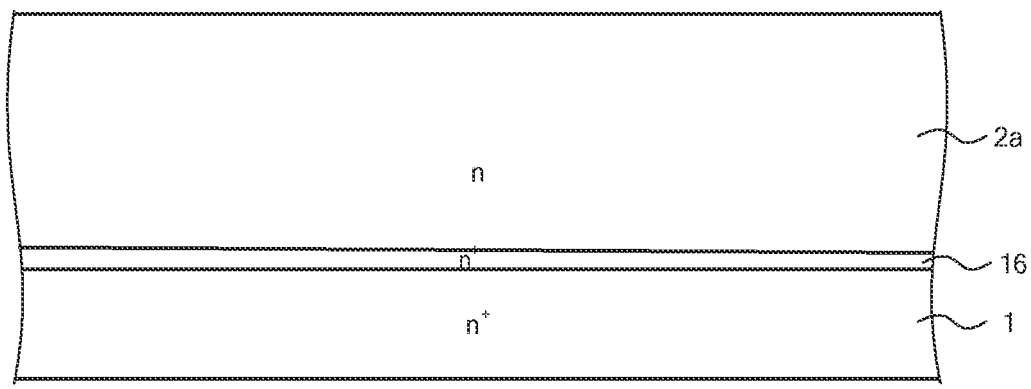
FIG. 3 is a cross-sectional view of a state of the silicon carbide semiconductor device according to the embodiment during manufacture.

First, the n$^+$-type silicon carbide substrate 1 containing an n-type silicon carbide is prepared. On a first main surface the n$^+$-type silicon carbide substrate 1, the n$^+$-type buffer layer 16 may be epitaxially grown while an n-type impurity, for example, nitrogen atoms (N) is doped. An impurity concentration of the n$^+$-type buffer layer 16 is about equal an impurity concentration of the n$^+$-type silicon carbide substrate 1. Next, on the surface of the n$^+$-type buffer layer 16, a first n-type silicon carbide epitaxial layer 2a containing silicon carbide is epitaxially grown to have a thickness of, for example, about 30 μm while an n-type impurity, for example, nitrogen atoms is doped. The state up to here is depicted in FIG. 3.

Next, on the surface of the first n-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 4a and second p$^+$-type base regions 5 of a depth of about 0.5 μm.

Further, formation is such that a distance between one of the lower first p$^+$-type base regions 4a and one of the second p$^+$-type base regions 5 adjacent thereto becomes about 1.5 μm. An impurity concentration of the lower first p$^+$-type base regions 4a and the second p$^+$-type base regions 5 is set to be, for example, about 5×10$^{18}$/cm$^3$.

Figure 4:
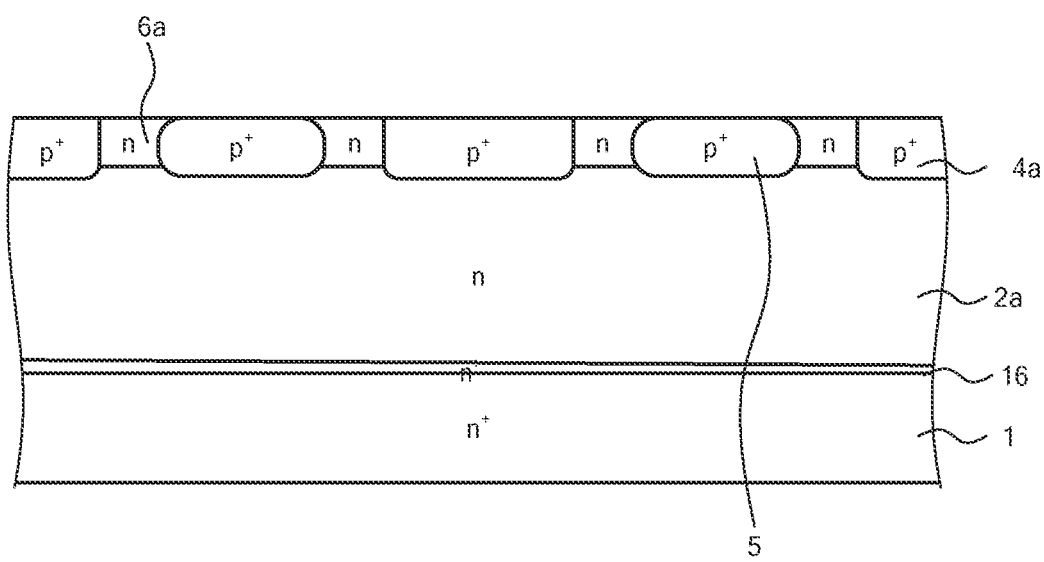
FIG. 4 is a cross-sectional view of a state of the silicon carbide semiconductor device according to the embodiment during manufacture.

Next, portions of the ion implantation mask may be removed, an n-type impurity such as nitrogen may be ion implanted in the openings, and in surface regions of the first n-type silicon carbide epitaxial layer 2a, for example, lower n-type high-concentration regions 6a of a depth of about 0.5 μm may be formed. An impurity concentration of the lower n-type high-concentration regions 6a is set to be, for example, about 1×10$^{17}$/cm$^3$. The state up to here is depicted in FIG. 4.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to be about 3×10$^{15}$/cm$^3$. Hereinafter, the first n-type silicon carbide epitaxial layer 2a and the second n-type silicon carbide epitaxial layer 2b combined are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, thereby forming upper first p$^+$-type base regions 4b of a depth of about 0.5 μm, overlapping the lower first p$^+$-type base regions 4a, respectively. Regions in which the lower first p$^+$-type base regions 4a and the upper first p$^+$-type base regions 4b are connected are formed, forming the first p$^+$-type base regions 4. An impurity concentration of the upper first p$^+$-type base regions 4b is set to be, for example, about 5×10$^{18}$/cm$^3$.

Figure 5:
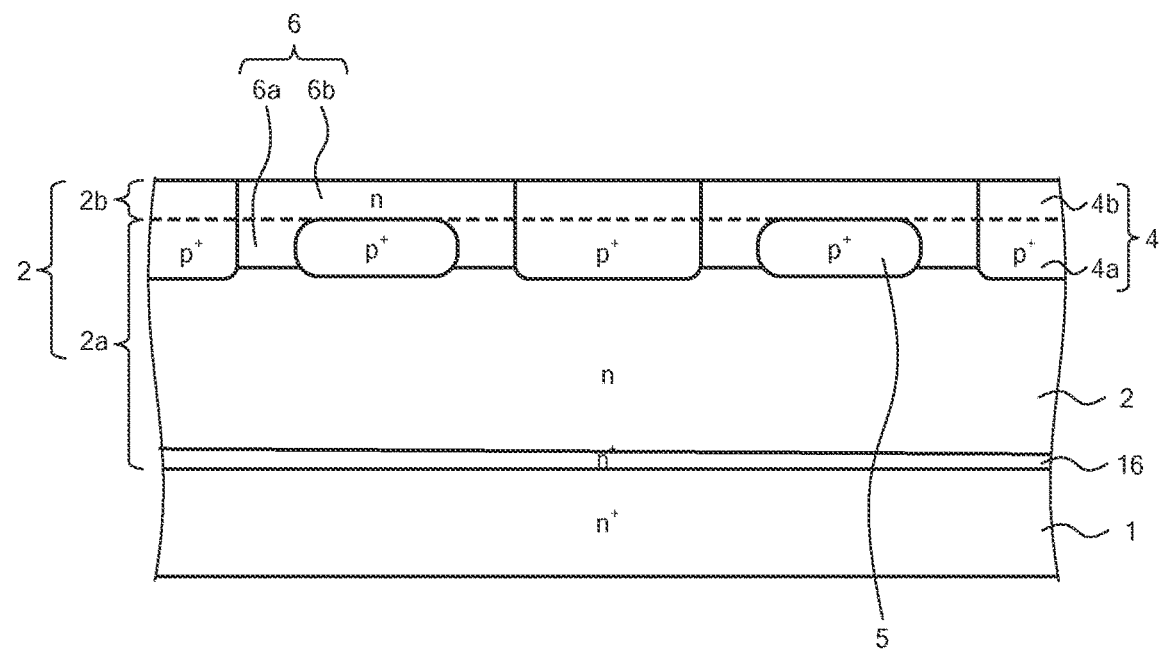
FIG. 5 is a cross-sectional view of a state of the silicon carbide semiconductor device according to the embodiment during manufacture.

Next, portions of the ion implantation mask may be removed, an n-type impurity such as nitrogen may be ion implanted in the openings, and in surface regions of the second n-type silicon carbide epitaxial layer 2b, for example, upper n-type high-concentration regions 6b of a depth of about 0.5 μm may be formed. An impurity concentration of the upper n-type high-concentration regions 6b is set to be, for example, about 1×10$^{17}$/cm$^3$. The upper n-type high-concentration regions 6b and the lower n-type high-concentration regions 6a are formed so as to contact one another at least partially, whereby the n-type high-concentration regions 6 are formed. Nonetheless, the n-type high-concentration regions 6 may be formed in an entire area of the substrate surface or may be omitted. The state up to here is depicted in FIG. 5.

Next, on the surface of the n-type silicon carbide epitaxial layer 2, the p-type silicon carbide epitaxial layer 3 is formed by epitaxial growth to have a thickness of about 1.1 μm. An impurity concentration of the p-type silicon carbide epitaxial layer 3 is set to be about 4×10$^{17}$/cm$^3$. After the p-type silicon carbide epitaxial layer 3 is formed by epitaxial growth, in the p-type silicon carbide epitaxial layer 3, a p-type impurity such as aluminum may be further ion implanted in channel regions of the p-type silicon carbide epitaxial layer 3.

Figure 6:
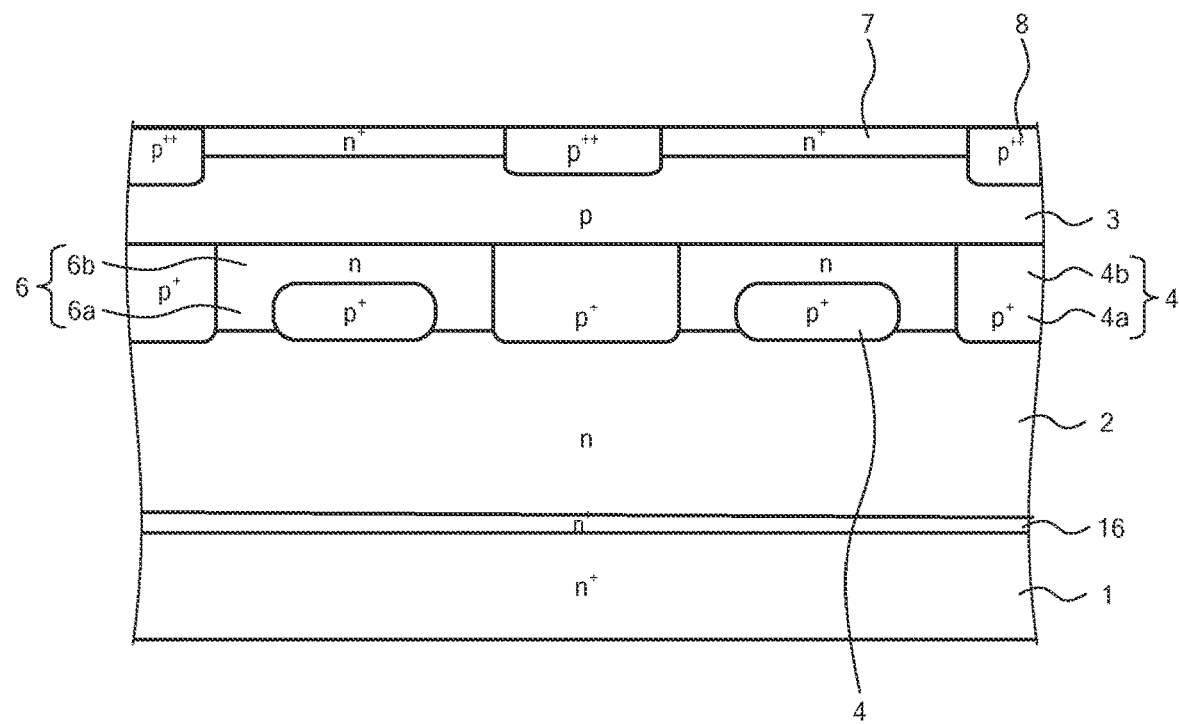
FIG. 6 is a cross-sectional view of a state of the silicon carbide semiconductor device according to the embodiment during manufacture.

Next, on the surface of the p-type silicon carbide epitaxial layer 3, an ion implantation mask having predetermined openings is formed by photolithography using, for example, an oxide film. An n-type impurity such as nitrogen (N) or phosphorus (P) is ion implanted in the openings, thereby forming the n$^+$-type source regions 7 in portions of the p-type silicon carbide epitaxial layer 3, at the surface thereof. Next, the ion implantation mask used in forming the n$^+$-type source regions 7 is removed and by a similar method, an ion implantation mask having predetermined openings may be formed, a p-type impurity such as phosphorus may be ion implanted in portions of the p-type silicon carbide epitaxial layer 3, at the surface thereof, and the p$^{++}$-type contact regions 8 may be formed. An impurity concentration of the p$^{++}$-type contact regions 8 is set to be higher than the impurity concentration of the p-type silicon carbide epitaxial layer 3. The state up to here is depicted in FIG. 6.

Similarly, in the gate runner 52, on the first main surface of the n$^+$-type silicon carbide substrate 1, the n$^+$-type buffer layer 16, the n-type silicon carbide epitaxial layer 2, the n-type high-concentration regions 6, the n$^+$-type source regions 7, and the p$^{++}$-type contact regions 8 are formed. The p$^+$-type region 20 may be formed by the same method as that for the first p$^+$-type base regions 4.

Next, a heat treatment (annealing) is performed under an inert gas atmosphere of a temperature of about 1700 degrees C., thereby implementing an activation process for the first p$^+$-type base regions 4, the second p$^+$-type base regions 5, the n$^+$-type source regions 7, the p$^{++}$-type contact regions 8, and the p$^+$-type region 20. As described above, ion implanted regions may be collectively activated by a single session of the heat treatment or may be activated by performing the heat treatment each time ion implantation is performed.

Figure 7:
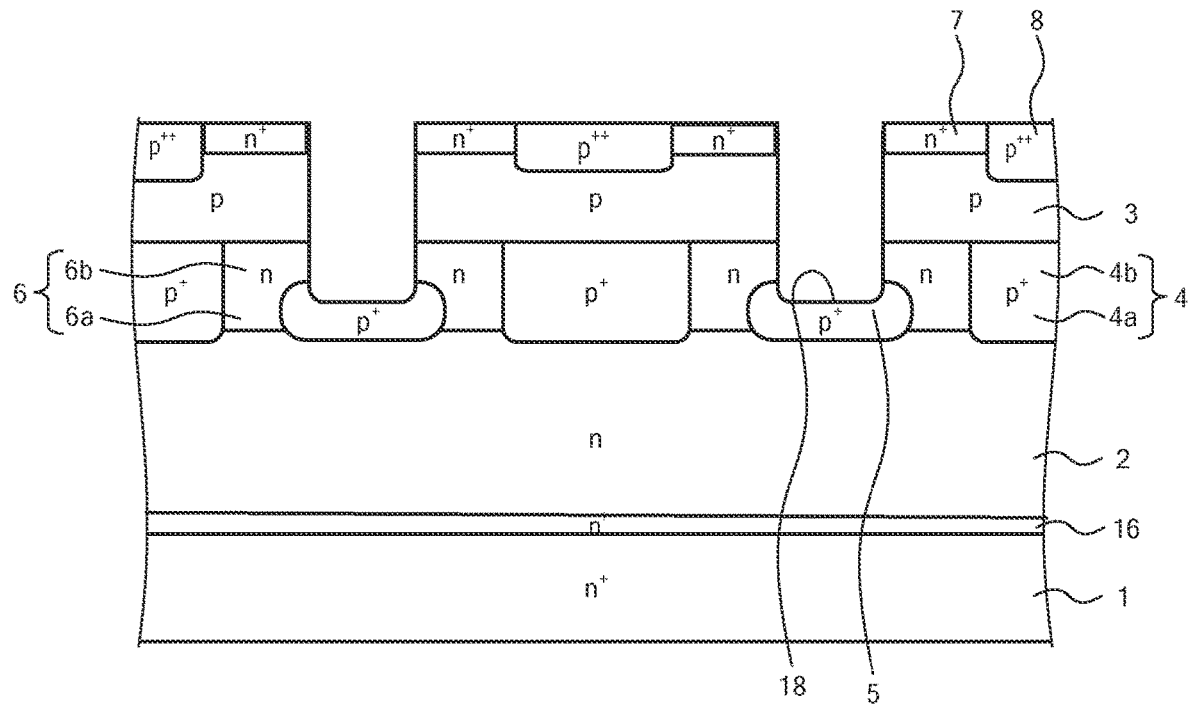
FIG. 7 is a cross-sectional view of a state of the silicon carbide semiconductor device according to the embodiment during manufacture.

Next, on the surface of the p-type silicon carbide epitaxial layer 3, a trench formation mask having predetermined openings is formed by photolithography using, for example, an oxide film. Next, the trenches 18 and the gate wiring trench 21 that penetrate the p-type silicon carbide epitaxial layer 3 and reach the n-type high-concentration regions 6 (2) are formed by dry etching. Bottoms of the trenches 18 may reach the second p$^+$-type base regions 5 formed in the n-type high-concentration regions 6 (2). The gate wiring trench 21 is formed so as to reach the p$^+$-type region 20. Next, the trench formation mask is removed. The state up to here is depicted in FIG. 7. In this manner, in the embodiment, the gate wiring trench 21 may be formed concurrently with the trenches 18 and therefore, modification of a process for the semiconductor device structure is unnecessary.

Figure 9:
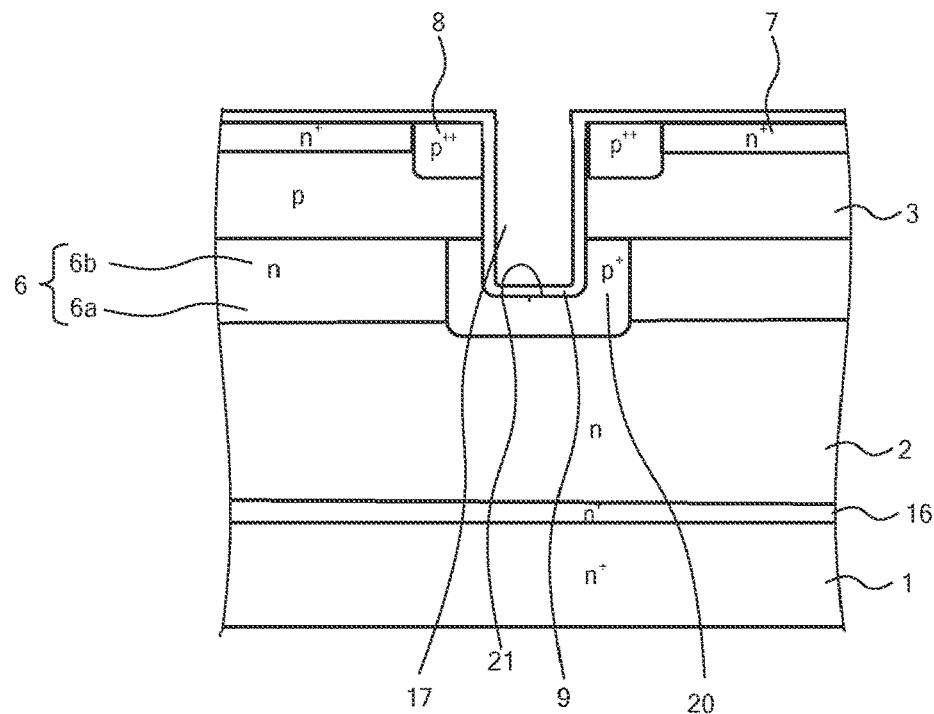
FIG. 9 is a cross-sectional view of a state of the silicon carbide semiconductor device according to the embodiment during manufacture.

Next, along the surfaces of the $n^+$-type source regions 7 and along the bottoms and sidewalls of the trenches 18 and the gate wiring trench 21, the gate insulating films 9 are provided. The gate insulating films 9 may be formed by thermal oxidation at a temperature of about 1000 degrees C. under an oxygen atmosphere. Further, the gate insulating films 9 may be formed by a deposition method by a chemical reaction such as that for a high temperature oxide (HTO). The state of the gate runner 52 up to here is depicted in FIG. 9.

Next, on the gate insulating films 9, a polycrystalline silicon film doped with, for example, phosphorus atoms is formed. The polycrystalline silicon film may be formed so as to be embedded in the trenches 18. The polycrystalline silicon film is patterned by photolithography and left in the trenches 1, whereby the gate electrodes 10 are formed.

Figure 10:
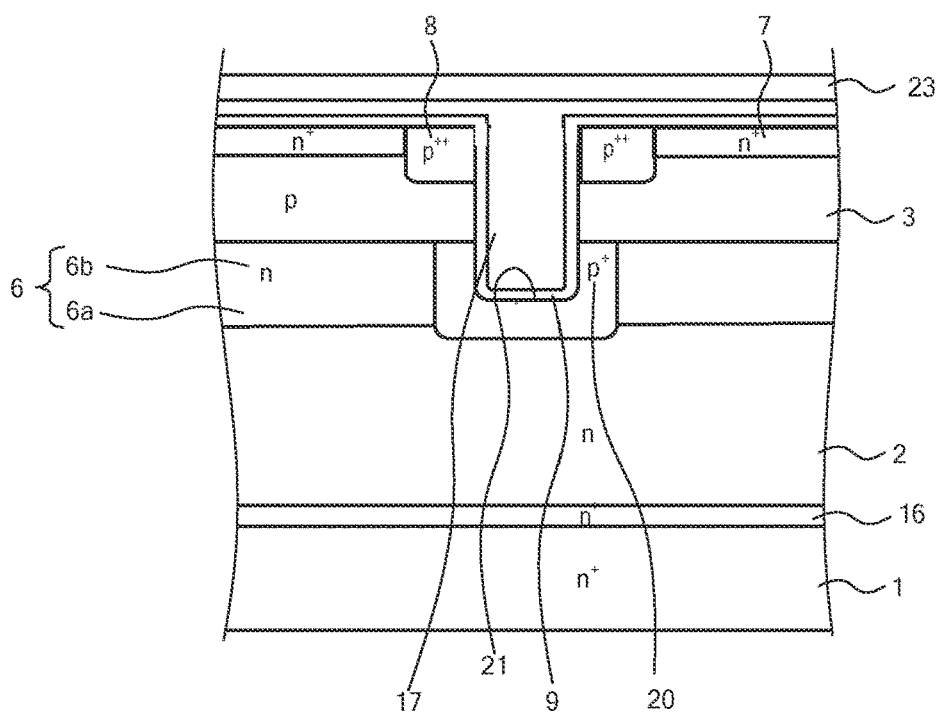
FIG. 10 is a cross-sectional view of a state of the silicon carbide semiconductor device according to the embodiment during manufacture.

Similarly, in the gate runner 52, a polycrystalline silicon film may be formed so as to be embedded in the gate wiring trench 21. The polycrystalline silicon film is patterned by photolithography and left in the gate wiring trench 21, whereby the polycrystalline silicon layer 17 is formed. Next, in the gate runner 52, on the polycrystalline silicon layer 17, a nickel film 23 is formed. The state of the gate runner 52 up to here is depicted in FIG. 10.

Next, the nickel film 23 is patterned by photolithography and only a region corresponding to the portion S operating as the gate runner is left. Next, a portion or an entire area of the polycrystalline silicon layer 17 is converted into a silicide by a temperature at which only silicon in a silicon carbide semiconductor layer covered by the gate insulating films 9 reacts, for example, about 500 degrees C., whereby the silicide layer 22 is formed. Here, while only the gate runner 52 is converted into a silicide, the gate electrodes 10 of the MOS structure region 51 may also be converted into a silicide. As a metal for forming the silicide layer 22, other than nickel, chromium (Cr), aluminum (Al), iron (Fe), molybdenum (Mo), or the like may be used.

While the polycrystalline silicon embedded in the gate wiring trench 21 has a recessed shape due to the etching, like the embodiment, when the silicide layer 22 is formed, the silicide layer 22 is raised and adhesion with a barrier metal, etc. is enhanced. In an instance in which the silicide layer 22 is formed in the trenches 18 as well, similarly, adhesion with a barrier metal, etc. is enhanced.

Figure 8:
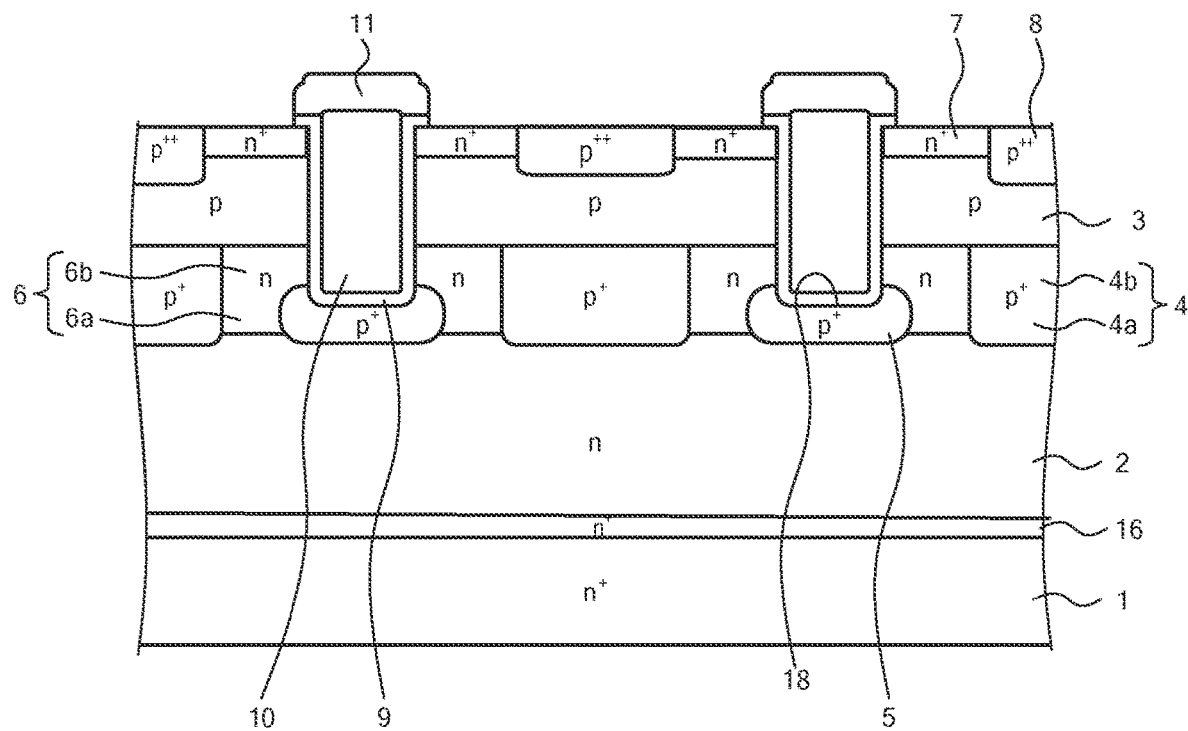
FIG. 8 is a cross-sectional view of a state of the silicon carbide semiconductor device according to the embodiment during manufacture.

Next, for example, a phosphate glass is deposited so as to cover the gate insulating films 9 and the gate electrodes 10 and to have a thickness of about 1 μm, thereby forming the interlayer insulating film 11. The interlayer insulating film 11 and the gate insulating films 9 are patterned by photolithography, whereby contact holes exposing the $n^+$-type source regions 7 and the $p^{++}$-type contact regions 8 are formed. In an instance in which the $p^{++}$-type contact regions 8 are omitted, contact holes exposing the $n^+$-type source regions 7 and the p-type silicon carbide epitaxial layer 3 are formed. Thereafter, a heat treatment (reflow) is performed, whereby the interlayer insulating film 11 is planarized. The state up to here is depicted in FIG. 8. Further, after the contact holes are formed in the interlayer insulating film 11, a barrier metal may be formed by titanium (Ti) or titanium nitride (TiN) or stacked layers of titanium and titanium nitride. In this instance, contact holes exposing the $n^+$-type source regions 7 and the $p^{++}$-type contact regions 8 are provided in the barrier metal.

Next, in the contact holes provided in the interlayer insulating film 11 and on the interlayer insulating film 11, a conductive film that forms the source electrodes 13 is formed. The conductive film, for example, a nickel (Ni) film. Further, on a second main surface of the $n^+$-type silicon carbide substrate 1, a nickel (Ni) film is similarly formed. Thereafter, for example, a heat treatment of a temperature of about 970 degrees C. is performed, whereby the nickel film in the contact holes is converted into a silicide, thereby forming the source electrodes 13. Concurrently, the nickel film formed on the second main surface becomes the back electrode 14 that forms an ohmic contact with the $n^+$-type silicon carbide substrate 1. Thereafter, unreacted portions of the nickel film are removed, thereby leaving the nickel film in, for example, only the contact holes as the source electrodes 13.

Next, the source electrode pad 15 is formed so as to be embedded in the contact holes. A portion of a metal layer deposited to form the source electrode pad 15 may be used as a gate pad. On the back surface of the $n^+$-type silicon carbide substrate 1, a metal film such as a nickel (Ni), a titanium (Ti) film, etc. is formed in a contact portion of the back electrode 14, using sputtering deposition. The metal film may be formed by a combination of stacked Ni films and Ti films. Thereafter, annealing such as rapid thermal annealing (RTA) is implemented so as to convert the metal film into a silicide and form an ohmic contact. Thereafter, for example, a thick film in which a Ti film, a Ni film, and a gold (Au) film are sequentially stacked is formed by electron beam (EB) deposition, whereby the back electrode 14 is formed.

In the epitaxial growth and ion implantation described above, for example, nitrogen (N) or phosphorus (P) that are an n-type with respect to silicon carbide, arsenic (As), antimony (Sb), etc. may be used as an n-type impurity (n-type dopant). As a p-type impurity (p-type dopant), for example, boron (B) or aluminum (Al) that are a p-type with respect to silicon carbide, gallium (Ga), indium (In), thallium (Tl), etc. may be used. In this manner, the trench-type MOSFET 50 depicted in FIG. 1 is completed.

Figure 11:
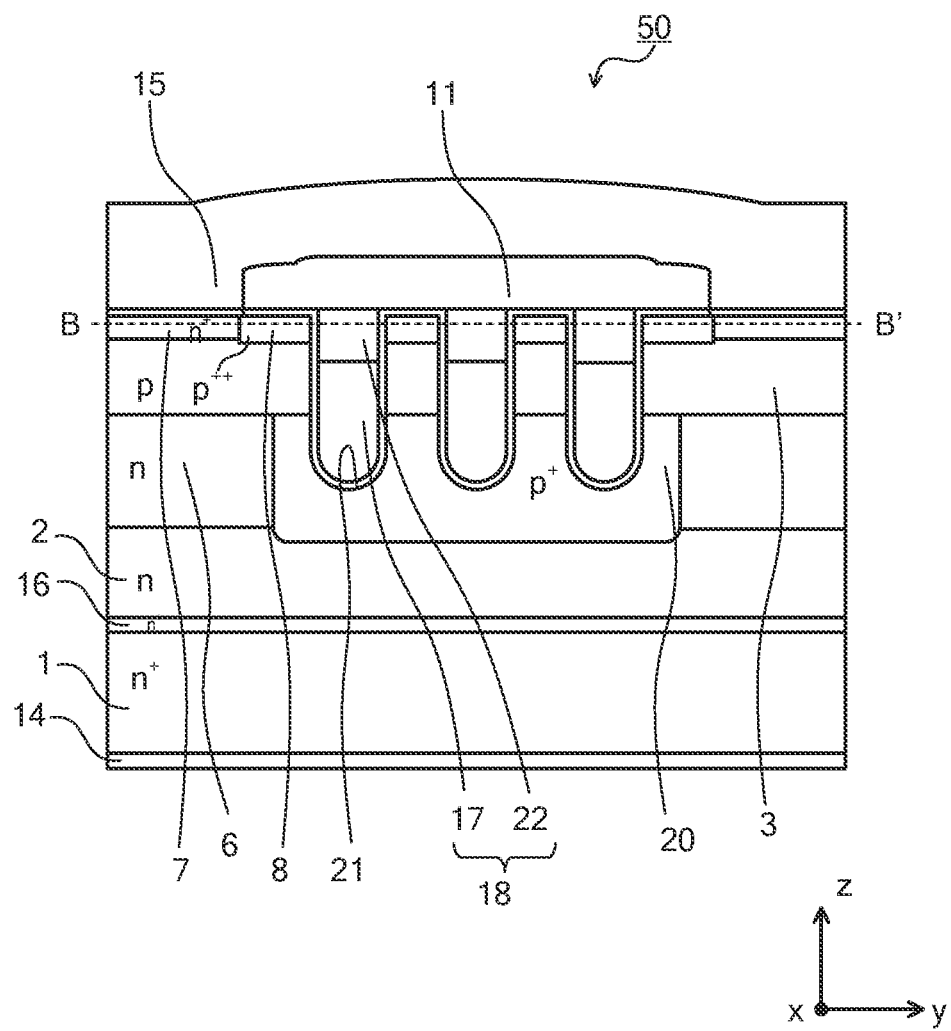
FIG. 11 is a cross-sectional view of another structure of the silicon carbide semiconductor device according to the embodiment.
Figure 12:
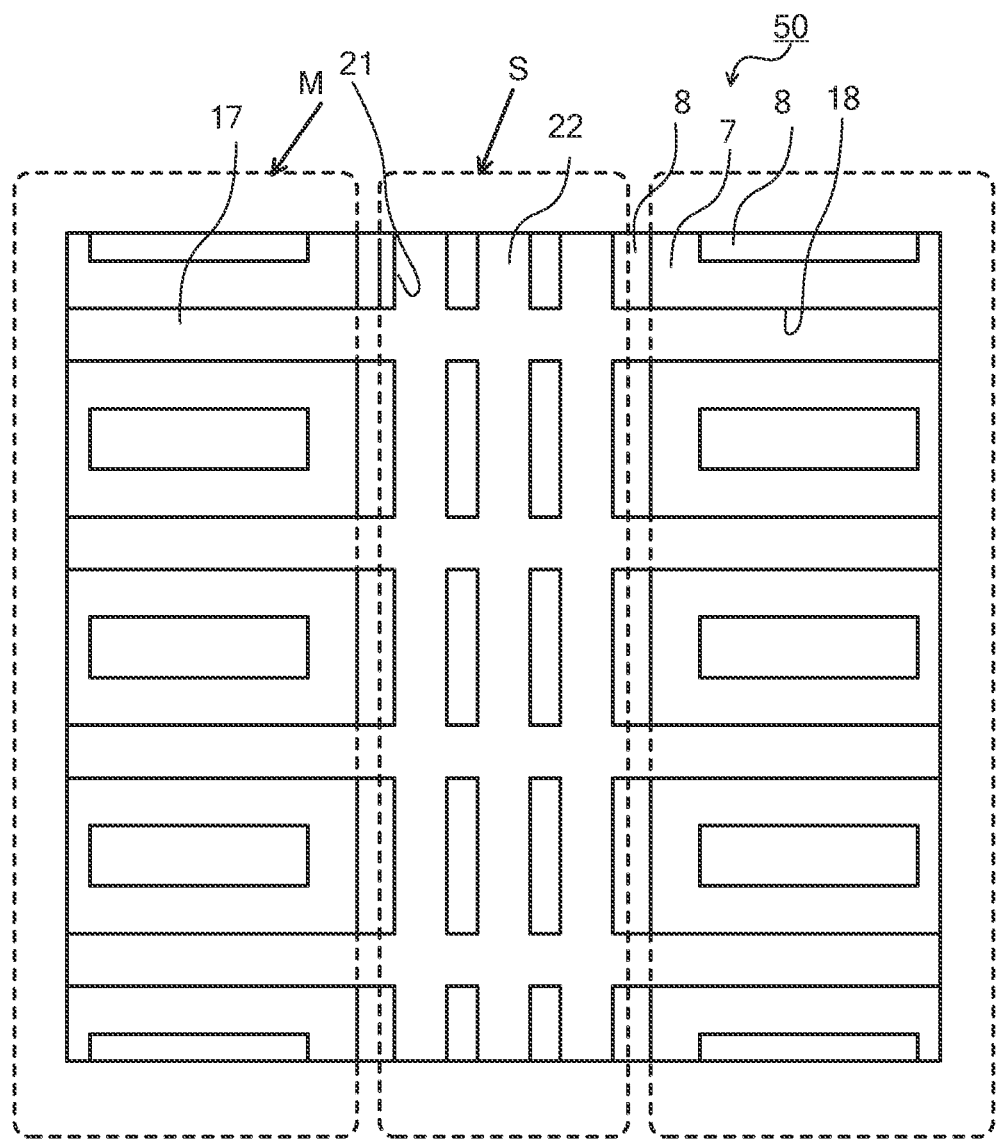
FIG. 12 is a top view of the other structure of the silicon carbide semiconductor device according to the embodiment, corresponding to a portion B-B' depicted in FIG. 11.
Figure 13:
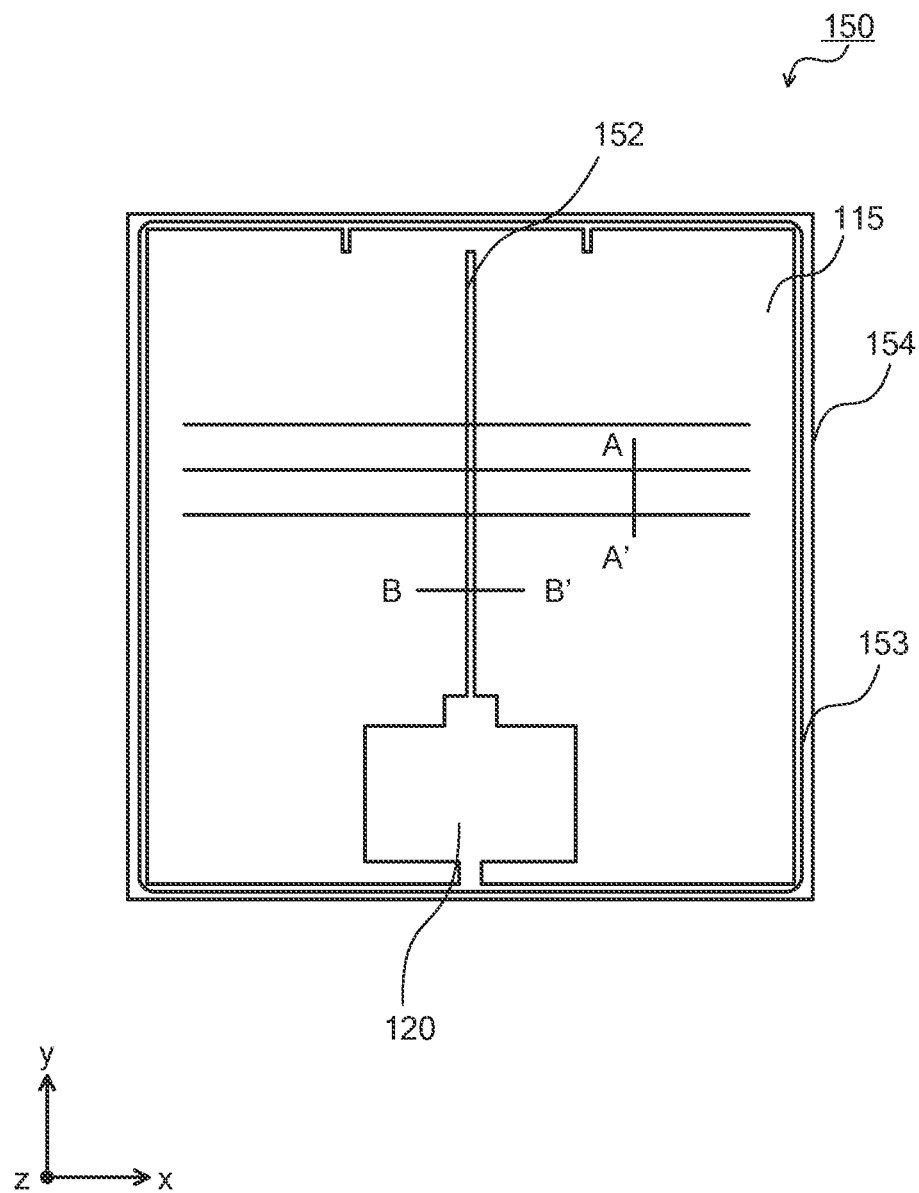
FIG. 13 is a top view of a structure of a conventional silicon carbide semiconductor device.

FIG. 11 is a cross-sectional view of another structure of the silicon carbide semiconductor device according to the embodiment. FIG. 12 is a top view of the other structure of the silicon carbide semiconductor device according to the embodiment, corresponding to a portion B-B' depicted in FIG. 11. As depicted in FIGS. 11 and 12, the gate wiring trench 21 may be provided in plural in the portion S operating as the gate runner. The gate wiring trenches 21 are arranged along a direction (y-axis direction) that is orthogonal to the direction (x-axis direction) in which the gate wiring trenches 21 extend.

When a p-type polycrystalline silicon is used for the polycrystalline silicon layer 17, the resistance increases as compared to an n-type. Therefore, as depicted in FIGS. 11 and 12, by providing the gate wiring trench 21 in plural, the gate resistance may be reduced. When the width of the gate wiring trench 21 is increased, embedding of the polycrystalline silicon layer 17 may be insufficient and voids may occur therein; and therefore, preferably, the gate wiring trench 21 may be provided in plural rather than increasing the width thereof.

As described above, according to the silicon carbide semiconductor device according to the embodiment, the gate runner of the active region has a trench structure, and a silicide layer and a polycrystalline silicon layer are embedded each trench thereof. As a result, the area of the gate runner of the active region is reduced and an area used for the MOS structures may be increased. Further, by providing the silicide layer, the gate resistance may be reduced. Furthermore, unlike a conventional configuration, the gate wiring is not exposed at the surface and therefore, constraints on wiring bonding positions are eliminated.

In the foregoing, various modifications within a range not departing from the spirit of the invention are possible, for example, in the embodiments described above, dimensions, impurity concentrations, etc. of regions are set according to necessary specifications. Further, in the embodiments, while the first conductivity type is assumed to be an n-type and the second conductivity type is assumed to be a p-type, the present invention is similarly implemented when the first conductivity type is a p-type and the second conductivity type is an n-type.

A silicon carbide semiconductor device according to the invention achieves an effect in that reduction of the active region is suppressed and a structure is realized that does not add constraints on wire bonding regions.

As described above, a silicon carbide semiconductor device according to the present invention is useful for power semiconductor devices used in power converting equipment such as inverters, power source devices of various types of industrial machines, and automobile igniters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device having an active region through which a main current passes during an ON state, comprising:
in the active region,
a silicon carbide semiconductor substrate of a first conductivity type, the silicon carbide semiconductor substrate having a front surface and a back surface that are opposite to each other;
a first semiconductor layer of the first conductivity type, provided on the front surface of the silicon carbide semiconductor substrate, the first semiconductor layer having an impurity concentration lower than an impurity concentration of the silicon carbide semiconductor substrate, the first semiconductor layer having a first surface and a second surface that are opposite to each other, the second surface facing the silicon carbide semiconductor substrate;
a second semiconductor layer of a second conductivity type, selectively provided on the first surface of the first semiconductor layer, the second semiconductor layer having a first surface and a second surface that are opposite to each other, the second surface facing the first semiconductor layer;
a plurality of first semiconductor regions of the first conductivity type, each selectively provided in the second semiconductor layer, at the first surface thereof;
a plurality of first trenches each penetrating the second semiconductor layer and reaching the first semiconductor layer;
a plurality of gate electrodes provided in the first trenches, via a plurality of gate insulating films, respectively;
a plurality of first electrodes each provided on surfaces of the second semiconductor layer and the first semiconductor regions;
a second electrode provided on the back surface of the silicon carbide semiconductor substrate;
a second trench that penetrates the second semiconductor layer and reaches the first semiconductor layer;
a polycrystalline silicon layer provided in the second trench, via one of the gate insulating films, the polycrystalline silicon layer having a first surface and a second surface that are opposite to each other, the second surface facing the silicon carbide semiconductor substrate;
a silicide layer selectively provided in the polycrystalline silicon layer, at the first surface thereof; and
an interlayer insulating film provided on the gate electrodes and the silicide layer, wherein
the polycrystalline silicon layer and the silicide layer are electrically connected with the gate electrodes.

2. The silicon carbide semiconductor device according to claim 1, wherein
the second trench extends in a direction that is orthogonal to a direction in which the first trenches extend.

3. The silicon carbide semiconductor device according to claim 1, wherein
a width of the second trench is at most 1 µm.

4. The silicon carbide semiconductor device according to claim 1, wherein
a width of the second trench is equal to a width of each of the first trenches.

5. The silicon carbide semiconductor device according to claim 1, wherein
the second trench includes a plurality of the second trenches arranged along a direction parallel to a direction in which the first trenches extend.

6. The silicon carbide semiconductor device according to claim 1, wherein
a distance between the silicide layer and one of the first semiconductor regions is at least equal to a depth of the second trench.

* * * * *